United States Patent
Maeda et al.

(10) Patent No.: US 8,298,869 B2
(45) Date of Patent: Oct. 30, 2012

(54) RESIN PACKAGE AND PRODUCTION METHOD THEREOF

(75) Inventors: Mitsuo Maeda, Tsukuba (JP); Yasuo Matsumi, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 519 days.

(21) Appl. No.: 12/406,997

(22) Filed: Mar. 19, 2009

(65) Prior Publication Data

US 2010/0072433 A1 Mar. 25, 2010

(30) Foreign Application Priority Data

Mar. 21, 2008 (JP) .............................. P2008-073897

(51) Int. Cl.
*H01L 21/60* (2006.01)
(52) U.S. Cl. ........ 438/123; 438/124; 438/127; 438/686; 438/687; 438/745; 257/E21.219; 257/E21.504; 257/E21.506
(58) Field of Classification Search .................. 438/123, 438/127, 745, 124, 686, 687; 257/E21.219, 257/E21.504, E21.506
See application file for complete search history.

(56) References Cited

U.S. PATENT DOCUMENTS 5,328,811 A * 7/1994 Brestel .......................... 430/325
2004/0207056 A1 10/2004 Seki et al.

FOREIGN PATENT DOCUMENTS

| CN | 1538518 A | 10/2004 |
| JP | 1-106458 A | 4/1989 |
| JP | 4-107933 A * | 4/1992 |
| JP | 8-167686 A | 6/1996 |
| JP | 3922058 B2 | 3/2007 |

OTHER PUBLICATIONS

State Intellectual Property Office, P.R. China, "First Office Action," issued in connection with Chinese Patent Application No. 200910129818.2, dated Apr. 6, 2012.

* cited by examiner

*Primary Examiner* — Mary Wilczewski
*Assistant Examiner* — Toniae Thomas
(74) *Attorney, Agent, or Firm* — Sughrue Mion, PLLC (57) ABSTRACT

The method for producing a resin package according to the present invention includes a step of forming a copper oxide layer by oxidizing the surface of a lead frame in which at least the surface is made of copper, and a step of forming a resin package main unit by allowing a resin to adhere to the copper oxide layer on the lead frame surface by resin molding for package, and then removing a predetermined area of the copper oxide layer with an acidic solution.

7 Claims, 7 Drawing Sheets

|  | STRIPPER | WEIGHT CHANGE (mg/min·mm$^2$) |
|---|---|---|
| EXAMPLE 1 | 1wt% $H_2SO_4$ | $3.75 \times 10^{-3}$ |
| EXAMPLE 2 | 10wt% $H_2SO_4$ | $9.83 \times 10^{-3}$ |
| EXAMPLE 3 | 20wt% $H_2SO_4$ | $1.44 \times 10^{-2}$ |
| EXAMPLE 4 | 30wt% $H_2SO_4$ | $1.93 \times 10^{-2}$ |
| EXAMPLE 5 | 10wt% $HNO_3$ | $3.88 \times 10^{-3}$ |
| EXAMPLE 6 | 20wt% $HNO_3$ | $7.08 \times 10^{-3}$ |
| EXAMPLE 7 | 30wt% $HNO_3$ | $2.27 \times 10^{-2}$ |
| EXAMPLE 8 | 3.5wt% HCl | $1.77 \times 10^{-2}$ |
| COMPARATIVE EXAMPLE 1 | 5wt% HCl | $3.02 \times 10^{-2}$ |
| COMPARATIVE EXAMPLE 2 | 10wt% HCl | $7.71 \times 10^{-2}$ |
| COMPARATIVE EXAMPLE 3 | 90wt% HCOOH | $1.32 \times 10^{-3}$ |
| COMPARATIVE EXAMPLE 4 | 10wt% $H_3PO_4$ | $1.84 \times 10^{-3}$ |

| | STRIPPER | TEMPERATURE OF MOLD WHEN RESIN INJECTION | AIRTIGHTNESS | |
|---|---|---|---|---|
| | | | BEFORE STRIPPING $< 1 \times 10^{-8}$ Pa·m³/sec | AFTER STRIPPING $< 1 \times 10^{-8}$ Pa·m³/sec |
| EXAMPLE 9 | 1wt% $H_2SO_4$ | 300°C | 100% | 100% |
| EXAMPLE 10 | 10wt% $H_2SO_4$ | 300°C | 100% | 92% |
| EXAMPLE 11 | 20wt% $H_2SO_4$ | 300°C | 100% | 88% |
| EXAMPLE 12 | 30wt% $H_2SO_4$ | 300°C | 100% | 79% |
| EXAMPLE 13 | 10wt% $HNO_3$ | 300°C | 100% | 100% |
| EXAMPLE 14 | 20wt% $HNO_3$ | 300°C | 100% | 83% |
| EXAMPLE 15 | 30wt% $HNO_3$ | 300°C | 100% | 75% |
| EXAMPLE 16 | 3.5wt% HCl | 300°C | 100% | 83% |
| COMPARATIVE EXAMPLE 5 | 1wt% $H_2SO_4$ | 281°C | 92% | 92% |
| COMPARATIVE EXAMPLE 6 | 1wt% $H_2SO_4$ | 269°C | 73% | 73% |
| EXAMPLE 17 | 5wt% HCl | 300°C | 100% | 53% |
| EXAMPLE 18 | 10wt% HCl | 300°C | 100% | 0% |

RESIN PACKAGE AND PRODUCTION METHOD THEREOF

BACKGROUND OF THE INVENTION

1. Field of the Invention

The present invention relates to a resin package and a production method thereof.

2. Related Background Art

Micro-Electro-Mechanical Systems (MEMS) related to small actuators, various sensors, and the like promise to be the next generation of electronic device technologies. Most packages which form the exterior of individual electronic elements forming small actuators, various sensors, and the like using such MEMS technology are made of resin for reasons such as ease of molding, the light weight, and manufacturing costs. A problem with resin packages is that a resin material is formed around the lead frame having the areas where electronic elements are to be arranged, but the resin does not adhere very strongly to the surface of the lead frame. One way to improve the adhesive strength on the surface of the lead frame is to polish the surface of the lead frame with sand paper (such as Japanese Patent 3922058).

This method does allow the adhesive strength between the lead frame and the resin to be improved, but the lead frame surface resistance also ends up increasing.

SUMMARY OF THE INVENTION

In view of the above, an object of the present invention is to provide a method for producing a resin package capable of increasing the adhesive strength between the lead frame and the resin while preserving the high conductivity of the lead frame surface, as well as a resin package capable of better adhesive strength between the lead terminals and the resin while preserving the high conductivity of the lead terminal surface.

To address the above objects, the method for producing a resin package in the present invention includes the steps of (A) forming a copper oxide layer by oxidizing a surface of a lead frame in which at least the surface is made of copper, and (B) forming a resin package main unit by allowing a resin to adhere to the copper oxide layer on the lead frame by resin molding for package, and then removing a predetermined area of the copper oxide layer with an acidic solution.

In the method for producing a resin package in the present invention, the copper surface of a lead frame is oxidized to form a copper oxide layer on the lead frame, and resin is allowed to adhere on the copper oxide layer to form a resin package main unit. This type of manufacturing method can be used to increase the adhesion strength of the resin to the lead frame surface because of the roughness of the surface of the copper oxide layer formed through the oxidation of the copper surface of the lead frame. A predetermined portion of the copper oxide layer on the surface of the lead frame is also removed, thus ensuring that the conductivity of the predetermined portion of the lead frame can be preserved. A step (C) for forming a metallic layer in the predetermined area from which the copper oxide layer has been removed is preferably furthermore included after the step (B). Doing this allows the adhesive strength between the resin and the lead frame to be enhanced while preserving the high conductivity of the lead frame surface.

The lead frame preferably has a die pad on which an electronic element is to be arranged, and a lead area composed of a plurality of lead terminals, the resin package main unit preferably has a bottom portion disposed between the copper oxide layer on a side of the die pad and the copper oxide layer on a side of the lead area, and a side wall that is provided upright on the copper oxide layer on the lead area while surrounding the die pad, and the predetermined area is preferably an area surrounded by the side wall in the lead area.

The electronic element arranged on the die pad is bonded to lead terminals in the area surrounded by the side wall of the lead area. The predetermined area, wherein the surface is adjacent to the metallic layer, with no copper oxide layer interposed therebetween, can therefore be placed in the area surrounded by the side wall in the lead area, thereby increasing the conductivity of that predetermined portion. The power consumption of the electronic element mounted on the die pad can also accordingly be reduced.

In step (C), a copper oxide layer thickness A ($\mu$m), a lowest value d ($\mu$m) among $t_1$, $t_2$, and $t_3$, a copper oxide layer density $\rho$ (mg/mm$^3$), and an etching rate V (mg/min·mm$^2$) and etching time T (min) of the copper oxide layer in the etching solution preferably satisfy a following relational expressions: $d > (V/\rho) \times 1000 \times T > A$, and $2.0 \times 10^{-3} \leq V \leq 2.6 \times 10^{-2}$. Also, the $t_1$ is a thickness of the side wall in a direction perpendicular to a thickness direction of the copper oxide layer at an interface between the copper oxide layer and the side wall, the $t_2$ is a minimum total length from an inside surface of the bottom portion to an outside surface thereof, of the copper oxide layer formed along an interface between the bottom portion and the die pad, and the $t_3$ is a minimum total length from the inside surface of the bottom portion to the outside surface thereof, of the copper oxide layer formed along an interface between the bottom portion and the lead area.

When these conditions are met, it is possible to prevent through holes from being formed as a result of the etching in the copper oxide layers between the lead frame and the resin package main unit, even as the copper oxide layers on the die pad and the portion where there is no side wall in the lead area, thereby ensuring that the resin package is airtight.

The oxidizing method in step (A) is preferably a method selected from the group consisting of (a) a method for heating the lead frame in an oxygen atmosphere, (b) a method for immersing the lead frame in an alkali aqueous solution, (c) a method for immersing the lead frame in an alkali aqueous solution and anodizing the lead frame, and (d) a method for immersing the lead frame in an electrodeposition solution containing cupric ions, and providing current to the lead frame. It is therefore easier to oxidize the copper surface of the lead frame and easier to form a copper oxide layer on the surface of the lead frame.

The acidic solution also preferably includes at least one acid selected from the group consisting of sulfuric acid, nitric acid, and hydrochloric acid. Such an acidic solution can be used in the step for removing the copper oxide layers, so as to remove the copper oxide layers on the die pad while effectively preventing through holes from being formed as a result of etching in the copper oxide layers between the lead frame and the resin package main unit, and to effectively ensure that the resin package is airtight.

In step (B), a resin is preferably injected into a mold to perform molding, the resin is preferably a thermoplastic resin, and a temperature $T_1$ (° C.) of the mold when the resin is injected therein and a flow-starting temperature $T_2$ (° C.) of the resin preferably satisfy the following relational expression: $T_1$ (° C.) $\geq T_2$ (° C.) $-70$ (° C.).

The use of a thermoplastic resin as the resin in this manner enables simpler formation of the resin package. When the resin is injected at such a temperature, the resin will flow well into the mold, enabling the formation of a resin package with better adhesion between the lead frame and resin. The resin package formed by such a resin forming method also has the following advantages, as compared to resin packages produced by conventional methods. That is, the resin package has a better appearance, with virtually no visible weld lines caused by colliding resin flow, as well as far fewer flow marks, etc.

The thermoplastic resin is also preferably a liquid crystalline polymer. Liquid crystalline polymers having better fluidity, heat resistance, and rigidity can be used in this way to give a resin package having high rigidity and high quality.

The resin package of the invention is provided with lead terminals, a copper oxide layer formed on the surface of the lead terminals, a plurality of side walls made of resin and provided on the copper oxide layer, and a metallic layer provided on the lead terminals in an area surrounded by the side walls, with no copper oxide layer interposed therebetween.

In the resin package of the invention, a plurality of side walls made of resin are connected to lead terminals by the copper oxide layer formed on the surface of the lead terminals. Because the surface is roughened, the copper oxide layer can increase the adhesion strength between the resin and the surface of the lead terminals. The invention also has a metallic layer provided on the lead terminals, with no copper oxide layer interposed therebetween, in the area surrounded by side walls, thus ensuring the conductivity of the predetermined portion on the lead terminals. It is thus possible to increase the adhesive strength between the resin and the lead terminals while preserving the high conductivity of the lead terminals surface in the resin package of the present invention.

The method for producing a resin package in the present invention allows the adhesive strength between the lead frame and the resin to be increased. Furthermore forming a metallic layer in the predetermined area of the lead frame from which the copper oxide layer has been removed allows the high conductivity of the lead frame surface to be preserved. The resin package of the present invention allows the adhesive strength between the lead terminals and the resin to be increased while preserving the high conductivity of the lead terminal surface.

DESCRIPTION OF THE PREFERRED EMBODIMENTS

Preferred embodiments of the present invention are described in detail below with reference to the attached drawings. Elements that are the same or similar are indicated by the same symbols and will not be elaborated more than once.

Figure 1:
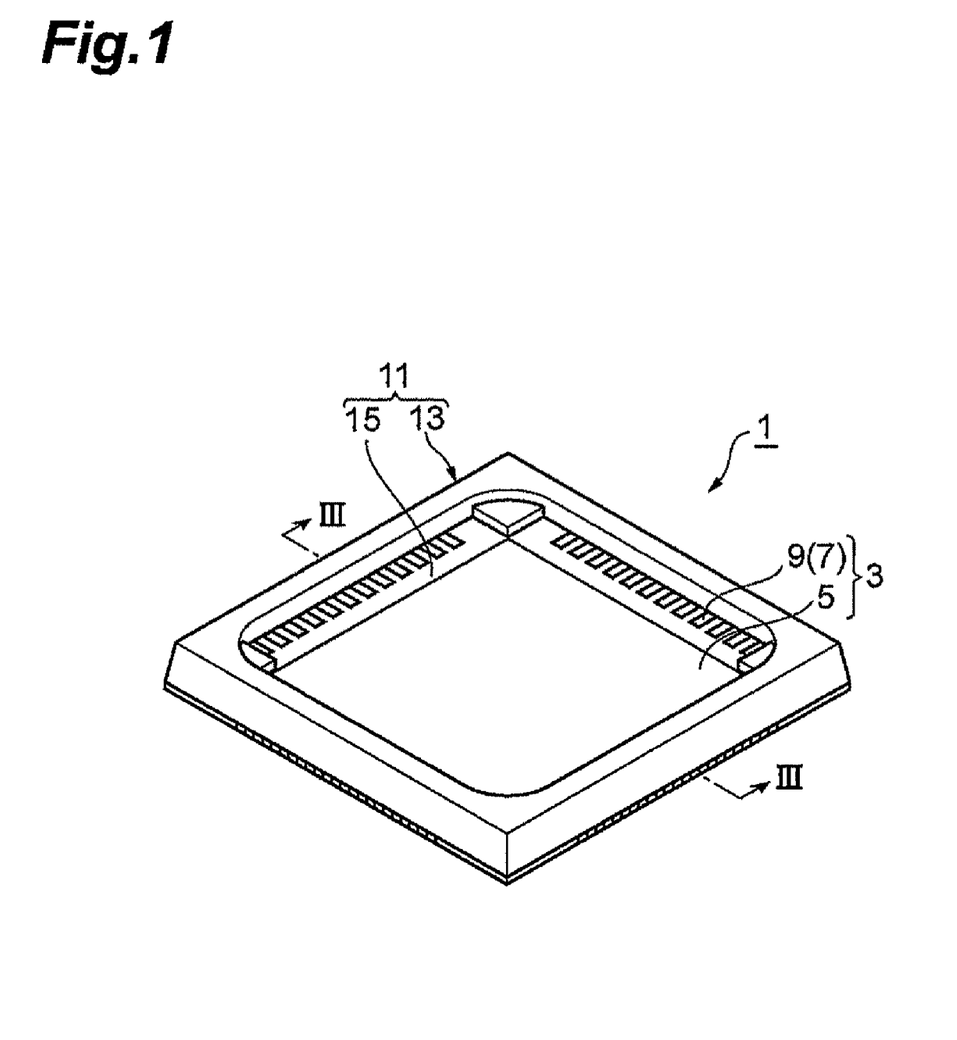
FIG. 1 is a perspective view of a resin package 1 in the present embodiment.
Figure 2:
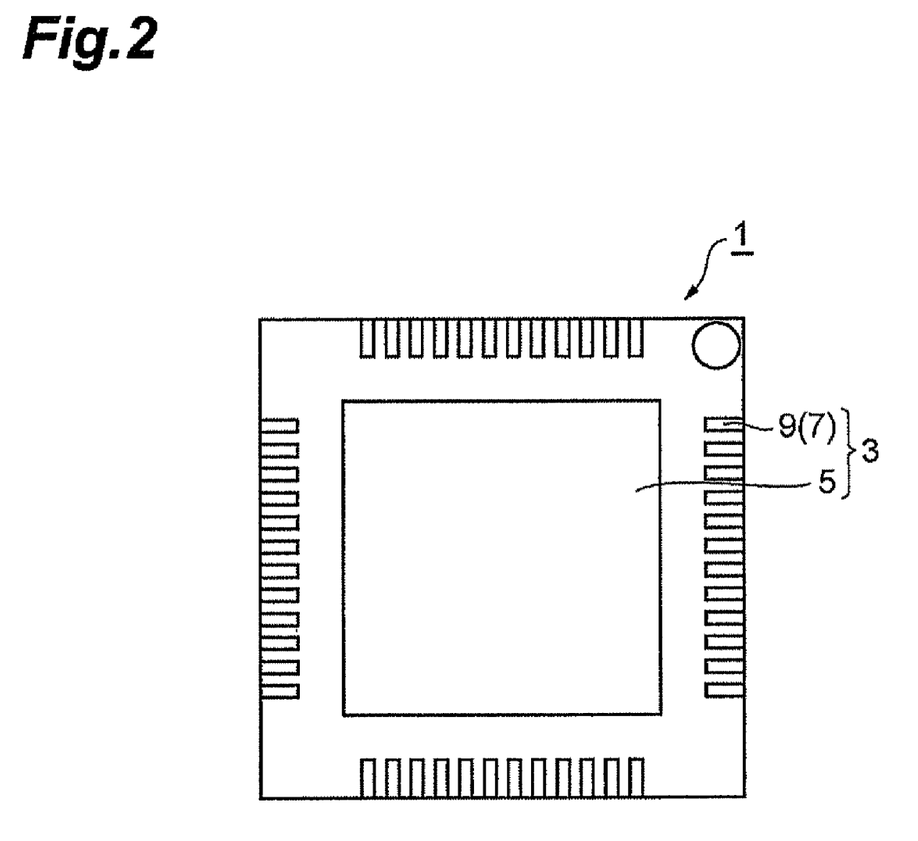
FIG. 2 is a bottom view of the resin package 1 shown in FIG. 1.
Figure 3A:
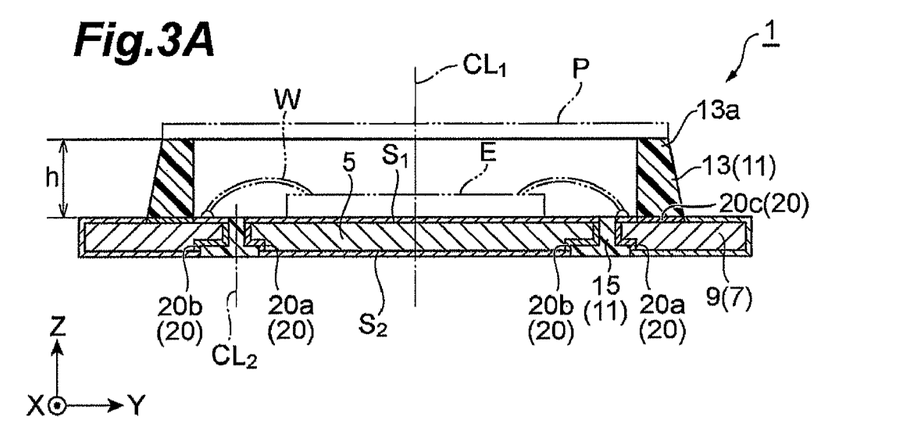
FIGS. 3A and 3B are cross sectional views, along the arrow III-III, of the resin package 1 shown in FIG. 1.
Figure 3B:
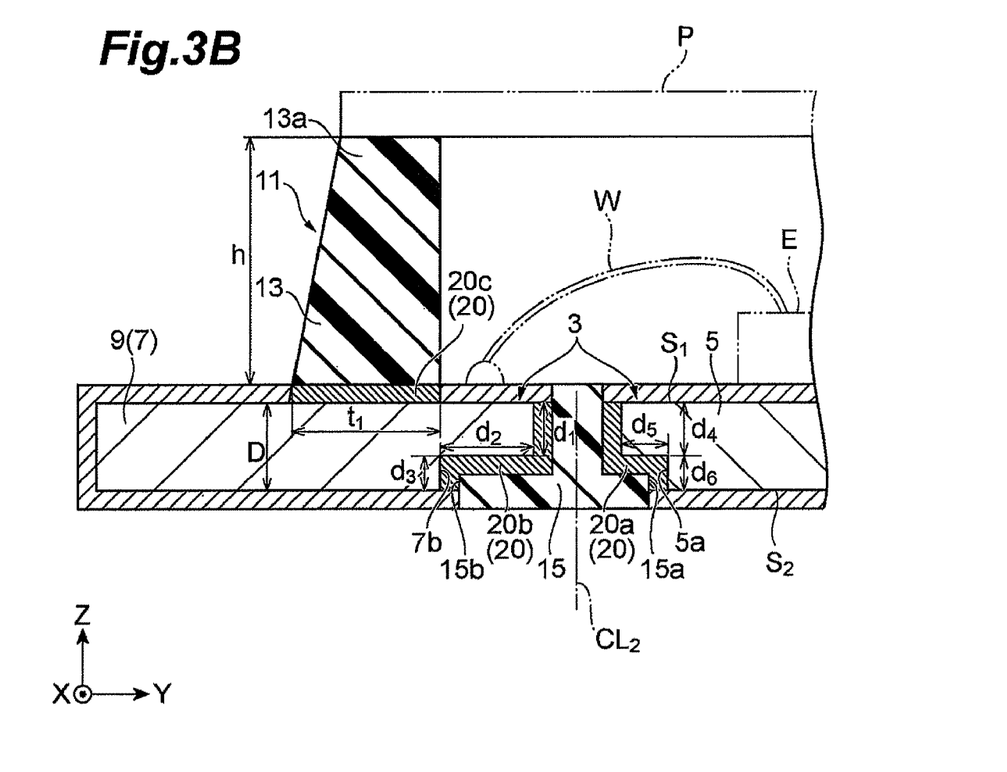

FIG. 1 is a perspective view of the resin package 1 in the present embodiment, and FIG. 2 is a bottom view of the resin package 1 in the present embodiment. FIG. 3A is a cross sectional view, along the arrow III-III, of the resin package 1 shown in FIG. 1, and FIG. 3B is a detail of the left side of the resin package 1 in FIG. 3A along the central axis $CL_1$. The resin package 1 in this embodiment is described below with reference to FIGS. 1 to 3B.

As shown in FIGS. 1 to 3B, the resin package 1 has a laterally symmetrical shape relative to the XZ plane including the central axis $CL_1$, and is composed of a lead frame 3, a resin package main unit 11 integrally joined to the lead frame 3, and copper oxide layers 20a, 20b, and 20c located between the lead frame 3 and the resin package main unit 11.

The resin package 1 is described below using FIG. 3B, which shows the resin package 1 on the left side of the central axis $CL_1$. The structure of the resin package 1 on the right side of the central axis $CL_1$ is symmetrical to the resin package 1 on the left side in relation to the XZ plane including the central axis $CL_1$, and will therefore not be further elaborated.

The resin package main unit 11 has a recess in the center for housing an electronic element, and a die pad 5 is located on the bottom portion in the recess. The lead frame 3 is composed of the die pad 5 on which an electronic element is to be arranged, and a lead area 7 separated from the die pad 5, surrounding the die pad 5, and composed of a plurality of lead terminals 9 extending outward from the die pad 5.

At least the surface of the lead frame 3 is made of copper, the thickness D being 0.25 mm. The side of the die pad 5 and the side of the opposing lead area 7 are each provided with a step that is asymmetrical relative to the XZ plane including the central axis $CL_2$ therebetween (see FIG. 3B), and although this may be symmetrical, in the present example the distance between the sides 5a and 7b located near the inside surface $S_1$ of the lead frame 3 is shorter than the distance between the sides 5a and 7b near the outside surface $S_2$ of the lead frame 3. A lead frame made of copper may also be used for the lead frame, and a copper alloy lead frame or a lead frame made of an iron alloy such as 42 alloy and plated with copper on the surface by a well known method may also be used.

The resin package main unit 11 is composed of a thermoplastic resin that is a liquid crystalline polymer (Sumikasuper E6008 by Sumitomo Chemical Co., Ltd.) with a flow-starting temperature $T_2$ of 320° C. The resin package main unit 11 has a bottom portion 15 provided between the side 5a of the die pad 5 and the side 7b of the lead area 7. These sides 5a and 7b face each other and have virtually symmetrical steps relative to the XZ plane including the central axis $CL_2$. The resin package main unit 11 also has a side wall 13 provided upright from the lead area 7 so as to surround the die pad 5. The positions of the two sides of the bottom portion 15 are generally aligned with the position of the inside surface $S_1$ and outside surface $S_2$ of the die pad 5 and the lead area 7 of the lead frame 3. The side wall 13 has a height h of 0.6 mm, and the thickness (maximum $t_1$) between the outside and inside of the side wall 13, that is, the width of the side wall 13, narrows in the direction of the height. The molded resin can thus be easily removed from the mold when produced. The thickness $t_1$ of the side wall 13 is 0.6 mm in the direction perpendicular (Y axial direction) to the thickness direction (Z axial direction) of the copper oxide layer 20 at the interface between the copper oxide layer 20 and side wall 13.

The side wall 13 also has a side wall top 13a. An electronic element E is mounted on the die pad 5, the electronic element E and the plurality of lead terminals 9 are bonded by a wire W, and a sealing plate P for rendering the interior of the resin package 1 airtight is disposed above the side wall top 13a.

Between the sides 15a and 15b of the bottom portion 15 of the resin package main unit 11 and the sides 5a and 7b of the die pad 5 and lead area 7, the copper oxide layers 20a and 20b are respectively provided, along the sides of the die pad 5 and lead area 7. The copper oxide layer 20c is also provided at the interface between the lead area 7 and the side wall 13 of the resin package main unit 11. The minimum total length $t_2$ (=$d_4+d_5+d_6$), from the inside surface $S_1$ to the outside surface $S_2$, of the bottom portion 15 of the copper oxide layer 20a is 0.55 mm, and minimum total length $t_3$ (=$d_1+d_2+d_3$), from the inside surface $S_1$ to the outside surface $S_2$, of the bottom portion 15 of the copper oxide layer 20b is 0.75 mm.

A gold plating layer (metallic layer) 33 is provided on a portion where there is no copper oxide layer 20c in the surface of the lead frame 3. A base plating layer is preferably formed before the formation of the gold plating layer in order to prevent poor plating layer adhesion, defective bonding, or the like. Examples of plating materials for the base plating layer include nickel and nickel alloys such as nickel-cobalt alloy, nickel-palladium alloy, and nickel-tin alloy, which may be used in combinations of two or more. The base plating may also be in the form of a stack of nickel/palladium or the like.

Examples of the above resin include thermosetting and thermoplastic resins. Examples of thermosetting resins include phenolic resins, urea resins, melamine resins, diallyl phthalate resins, epoxy resins, polyurethane resins, polyimide resins, and unsaturated polyester resins, although the use of phenolic resins and epoxy resins is preferred.

Examples of thermoplastic resins include polystyrene resins, acrylic resins, polycarbonate resins, polyester resins, polyamide resins, polyacetal resins, polyphenylene ether resins, fluororesins, polyphenylene sulfide resins, polysulfone resins, polyarylate resins, polyether imide resins, polyether sulfone resins, polyether ketone resins, liquid crystal polyester resins, polyamide imide resins, and polyimide resins, although the use of polyester resins, polyamide resins, polyphenylene sulfide resins, and liquid crystal polyester resins is preferred, and the use of liquid crystal polyester resins (liquid crystalline polymers) is ideal for the sake of better fluidity, heat resistance, and rigidity. These resins may be used alone or several may be used at the same time.

A method for producing the resin package 1 in the present embodiment, particularly a preferred method including the aforementioned step (C), is described below. FIGS. 4A to 4E schematically illustrate steps in a method for producing the resin package 1 in the present embodiment. The resin package 1 is produced through the following sequence of steps, for example.

(Step for Forming Copper Oxide Layer)

Figure 4A:
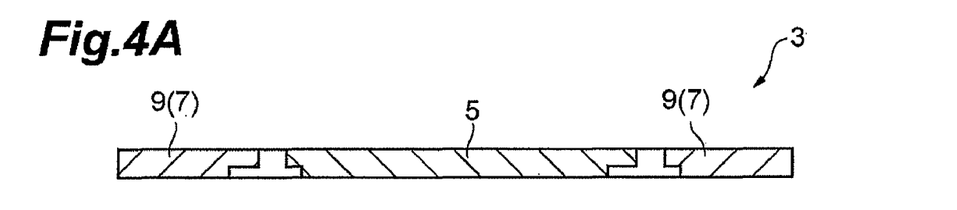
FIGS. 4A, 4B, 4C, 4D and 4E are cross sectional views schematically illustrating steps in a method for producing the resin package 1 in the present embodiment.
Figure 4B:
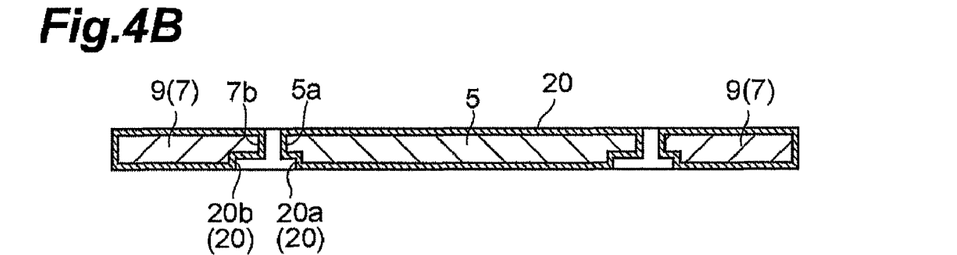

First, the lead frame 3 is prepared, and the surface is washed (FIG. 4A). Then, as shown in FIG. 4B, the lead frame 3 is oxidized to form the copper oxide layers 20 on the surface of the lead frame 3. The copper oxide layers 20 are formed under the following conditions using the methods (a) to (d) below.

The method (a) is described first. In the method (a), the lead frame 3 is heated in an oxygen atmosphere. As an example of the conditions in the method (a), the temperature range is 150° C. to 400° C., and the heating time is 10 min to 120 min.

The method (b) is described next. In the method (b), the lead frame 3 is immersed in alkali aqueous solution (such as an aqueous solution obtained by dissolving sodium chlorite, sodium hydroxide, and trisodium phosphate in water). As an example of the conditions in the method (b), the concentration is 5 to 150 g/L (sodium chlorite), 5 to 60 g/L (sodium hydroxide), or 5 to 200 g/L (trisodium phosphate), the bath temperature is 50 to 95° C., and the treatment time is 10 to 600 sec.

The method (c) is described next. In the method (c), the lead frame 3 is immersed in alkali aqueous solution (such as an aqueous solution obtained by dissolving sodium chlorite, sodium hydroxide, and trisodium phosphate in water), and the lead frame 3 is anodized. As an example of the conditions in the method (c), the concentration is 0 to 150 g/L (sodium chlorite), 5 to 60 g/L (sodium hydroxide), or 0 to 200 g/L (trisodium phosphate), the bath temperature is 45 to 80° C., the treatment time is 1 to 20 sec, and the current density is 0.2 to 10 A/dm$^2$.

The method (d) is described next. In the method (d), the lead frame 3 is immersed in an electrodeposition solution containing cupric ions (such as an aqueous solution obtained by dissolving copper sulfate, lactic acid, and sodium hydroxide in water), and current is applied to the lead frame 3. As an example of the conditions in the method (d), the concentration is 100 to 150 g/L (copper sulfate), 200 to 300 g/L (lactic acid), or 100 to 150 g/L (sodium hydroxide), the bath temperature is 45 to 80° C., the treatment time is 1 to 20 sec, and the current density is 0.2 to 10 A/dm$^2$.

The copper oxide layers 20, including the copper oxide layer 20a along the side 5a of the die pad 5 and the copper oxide layer 20b along the side 7b of the lead area 7, are thus formed on the surface of the lead frame 3.

(Step for Joining Resin)

Figure 4C:
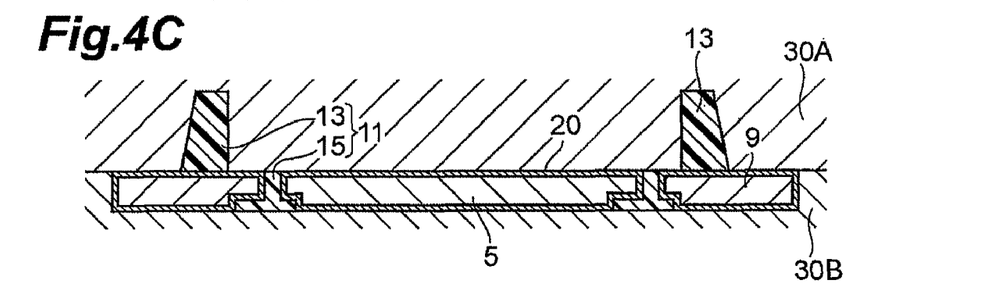

Then, as shown in FIG. 4C, the lead frame 3 with the copper oxide layers 20 formed on the surface is sandwiched between mutually facing molds 30A and 30B, resin is injected into the space formed between the lead frame 3 and the two molds 30A and 30B when the temperature $T_1$ of the molds 30A and 30B reaches 300° C., and the resin package main unit 11 is formed. Of the molds 30A and 30B used at this time, the cavity in the bottom mold 30B has a depth that is the same as the thickness of the lead frame 3 and has a shape and area into which the lead frame 3 fits, and the upper mold 30A has a concavity shaped to accommodate the side wall 13 in the portion covering the lead area 7.

(Step for Removing Copper Oxide Layer)

Figure 4D:
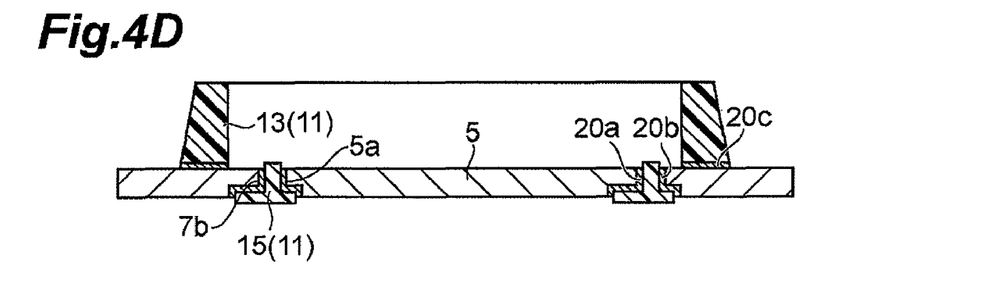

Then, as shown in FIG. 4D, an acidic solution is used for wet etching to remove the copper oxide layer on the die pad 5 and the copper oxide layer in the part of the lead area 7 where there is no side wall 13 on the upper surface. Etching is carried out until the copper oxide layer on the die pad 5 is gone, exposing the copper surface of the die pad 5 and the copper surface in the portion of the lead area 7 where there is no side wall 13 on the upper surface. This leaves the copper oxide layer 20a along the side 5a of the die pad 5, the copper oxide layer 20b along the side 7b of the lead area 7, and the copper oxide layer 20c between the lead area 7 and the side wall 13.

In this step, the acidic solution preferably includes at least one acid selected from the group consisting of sulfuric acid ($H_2SO_4$), nitric acid ($HNO_3$), and hydrochloric acid (HCl). The etching rate V (mg/min·mm$^2$) of the copper oxide layer 20 in the acidic solution preferably satisfies the following formulas.

$$d > (V/\rho) \times 1000 \times T > A \qquad (1)$$

$$2.0 \times 10^{-3} \leq V \leq 2.6 \times 10^{-2} \qquad (2)$$

Here, $\rho$ (mg/mm$^3$) is the density of the copper oxide layer, and A is the thickness of the copper oxide layer 20. Also d is the minimum among $t_1$, $t_2$, and $t_3$.

When the etching rate V satisfies such conditions, it is possible to prevent through holes from being formed as a result of the etching in the copper oxide layers 20a, 20b, and 20c between the lead frame 3 and the resin package main unit 11, even as the copper oxide layers 20 on the die pad 5 and the copper oxide layers 20 in the portion of the lead area 7 where there is no side wall 13 on the upper surface are etched off, thereby allowing the airtightness of the resin package 1 to be increased. Improving the airtightness of the resin package 1 can prevent external air and moisture from penetrating into the electronic element E inside the resin package 1 after the electronic element E has been placed on the die pad 5 and the top end of the side wall 13 of the resin package 1 has been sealed with the sealing plate P, thereby helping to prevent corrosion caused by external air and moisture as well as to prevent the reliability of the electronic element E from being thereby deteriorated.

(Step for Forming Metallic Layer)

Figure 4E:
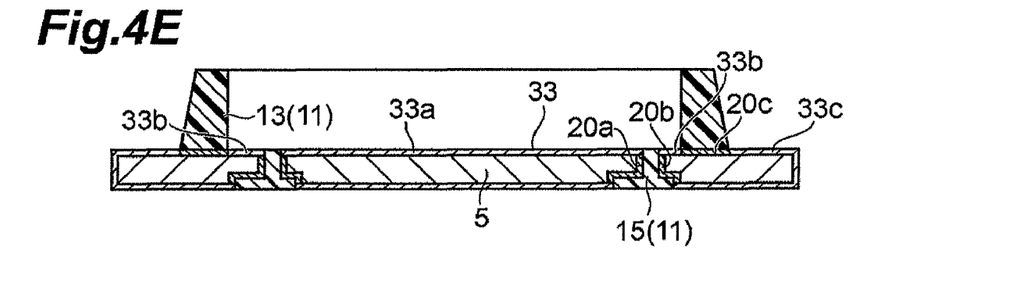

Then, as shown in FIG. 4E, gold plating layers (metallic layers) 33 are formed where the lead frame 3 is exposed in the area where the copper oxide layers have been removed. Electrolytic plating may be used, for example, to form the gold plating layer 33. Specifically, after the step for removing the copper oxide layers, the resin package 1 is immersed along with a plating anode in a solution in which gold has been dissolved and ionized, and current flows across the anode and cathode, where the treated die pad 5 and lead area 7 are used as the cathode. Metal (gold) ions are deposited on the surface of the treated objects, giving gold films (gold plating layers) 33 in the portion of the lead frame 3 where the copper surface is exposed. Specifically, it is possible to obtain a gold plating layer 33a on the die pad 5, a gold plating layer 33b on the portion of the lead terminals 9 surrounded by the side wall 13, and a gold plating layer 33c on the portion of the lead terminals 9 outside the side wall 13. The resin package 1 is thus complete. A base plating layer is also preferably formed before the formation of the gold plating layer in order to prevent poor plating layer adhesion, defective bonding, or the like. Examples of plating materials for the base plating layer include nickel and nickel alloys such as nickel-cobalt alloy, nickel-palladium alloy, and nickel-tin alloy, which may be used in combinations of two or more. The base plating may also be in the form of a stack of nickel/palladium or the like.

In the method for producing a resin package 1 in the present embodiment, the copper surface of the lead frame 3 is oxidized to form a copper oxide layer 20 on the lead frame 3, and the resin package main unit 11 is formed on the copper oxide layer 20. The adhesion strength between the resin package main unit 11 and the lead frame 3 can be increased because of the roughness of the surface of the copper oxide layer 20 formed through the oxidation of the copper surface of the lead frame 3.

The copper oxide layer on the die pad 5 and the copper oxide layer in the portion on the lead area 7 where there is no side wall 13 are also removed, and gold plating layers 33a, 33b, and 33c are formed by electrolytic plating in the portion where the copper oxide layers have been removed. The area surrounded by the side wall 13 in the lead area 7 bonded by a wire to the electronic element E after the electronic element E has been mounted on the die pad 5 is thus in contact with the gold plating layer 33b, with no copper oxide layer 20 interposed therebetween, thus allowing the high conductivity of that area to be preserved.

Also, the resin package main unit 11 of the resin package 1 produced by the method for producing the resin package 1 in this embodiment has a side wall 13 and bottom portion 15. The resin package main unit 11 has a side wall 13 to allow the electronic element E to be housed. The resin package main unit 11 also has a bottom portion 15 so that the base ends of the lead terminals 9 are secured by the resin material, and fewer lead terminals 9 fall out.

When the electronic element E on the die pad 5 and the lead terminals 9 are connected by the bonding wire W, ultrasonic vibrations are applied to the bonding wire W while the lead terminals 9 are connected by the bonding wire W, which is crimped to bond the pad to the terminals. A bottom portion 15 composed of resin is disposed between the die pad 5 and lead area 7, thus improving bondability.

Furthermore, when the copper oxide layers 20 are formed through the oxidation of the surface of the lead frame 3, a method for immersing the lead frame 3 in alkali aqueous solution (such as aqueous solution obtained by dissolving sodium chlorite, sodium hydroxide, and trisodium phosphate in water) is used as the method of oxidation. The copper oxide layers 20 can thus be easily formed on the surface of the lead frame 3. Electrolytic plating is also used to form the gold plating layers 33, thus allowing the gold plating layers 33 to be easily formed.

The resin package main unit 11 is also composed of a thermoplastic resin liquid crystalline polymer. The resin package main unit 11 is thus composed of a thermoplastic resin, and therefore enables simpler formation of the resin package 1. Thermoplastic resins thus have better fluidity, heat resistance, and rigidity, and therefore give a resin package 1 having particularly high rigidity and high quality.

Also, because the temperature $T_1$ of the molds 30A and 30B during the injection of the resin material is 300° C., and the flow-starting temperature $T_2$ of the resin is 320° C., $T_1$ and $T_2$ satisfy $T_1$ (° C.)$\leq T_2$ (° C.)−70 (° C.). When the resin is injected at such a temperature, the resin will flow well into the mold, enabling the formation of a resin package with better adhesion between the lead frame and resin. The resin package formed by such a resin forming method also has the following advantages, as compared to resin packages produced by conventional methods. That is, the resin package has a better appearance, with virtually no visible weld lines caused by colliding resin flow, as well as far fewer flow marks, etc.

In the resin package 1 of the invention, the lead frame 3 and resin package main unit 11 are also connected by the copper oxide layers 20a, 20b, and 20c. Because the surface is roughened, the copper oxide layers 20a, 20b, and 20c can increase the adhesion strength between the lead frame 3 and the resin package main unit 11. Also, in the area surrounded by the side wall 13 in the lead area 7, the gold plating layer 33b that has been provided is connected, without any copper oxide layer, thus ensuring the conductivity of the area surrounded by the side wall 13 in the lead area 7 wire and bonded to the electronic element E on the die pad 5.

The present invention is not limited to the embodiment described above. For example, the methods (a) to (d) are given as examples of methods for forming the copper oxide layers 20, but other methods may also be used. When the methods (a) to (d) are used, they are not limited to the conditions noted above. A gold plating layer 33 was provided as the metallic layer on the portion of the lead frame 3 surface where there is no copper oxide layer 20c, but silver plating layers or the like may also be used, not just gold plating layers.

EXAMPLES

The invention is described in further detail in, but is not limited to, the following examples and comparative examples.

[Test to Confirm Etching Rate]
(Conditions in Common)

First, the lead frame 3 was prepared and the surface was washed, and the method (b) noted above was used to form, on the lead frame 3, copper oxide layers 20 with a density ρ (=6.26 mg/mm$^3$) and a thickness A (=1.5 μm) under the conditions exemplified above. The copper oxide layers 20 were then removed (stripped) under the following conditions (Examples 1 to 8 and Comparative Examples 1 to 4).

Test Conditions in Examples 1 to 8

Figure 5:
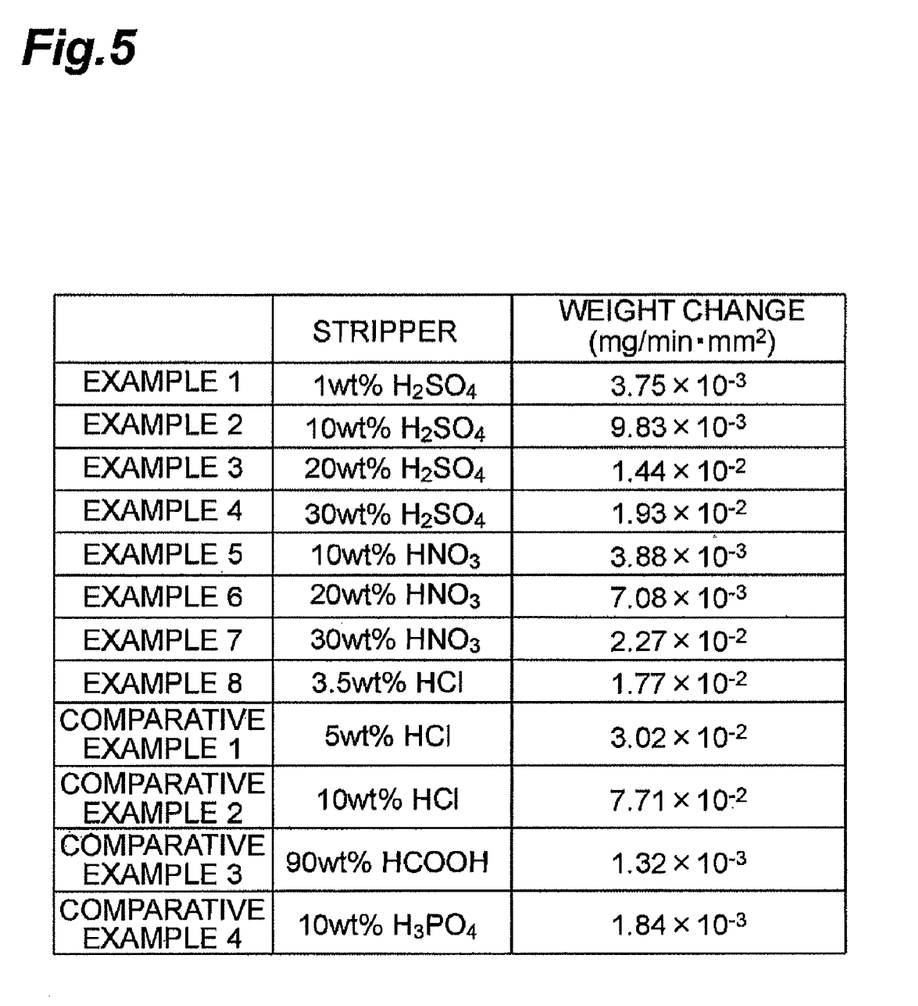
FIG. 5 is a table showing the etching rates for the copper oxide layer by type and concentration of acidic solution.

In Examples 1 to 8, the copper oxide layers 20 were removed (stripped) using sulfuric acid ($H_2SO_4$), nitric acid ($HNO_3$), and hydrochloric acid (HCl) with a predetermined concentration as the acidic solution (stripper) in the step for removing the copper oxide layers. Specific conditions are shown in FIG. 5.

Test Conditions in Comparative Examples 1 to 4

In Comparative Examples 1 to 4, the copper oxide layers 20 were removed (stripped) using hydrochloric acid (HCl), formic acid (HCOOH), and phosphoric acid ($H_3PO_4$) with a predetermined concentration as the acidic solution (stripper). Specific conditions are shown in FIG. 5.

(Evaluation and Results)

FIG. 5 shows the specific type and concentration of the acidic solution (stripper) used in Examples 1 to 8 and Comparative Examples 1 to 4 as well as the etching rates V (mg/min·mm$^2$) for the copper oxide layers 20 under those conditions. As shown in FIG. 5, the higher the sulfuric acid, nitric acid, and hydrochloric acid concentration, the higher the etching rate V. At the same concentrations, the etching rate V also tended to be higher in the order of sulfuric acid, nitric acid, and hydrochloric acid. It is also apparent that formic acid and phosphoric acid resulted in a lower etching rate V than sulfuric acid, nitric acid, and hydrochloric acid.

Numerical analysis of the etching rate V reveals that the etching rate V of the copper oxide layers 20 in each of the acidic solutions (each of the strippers) used in Examples 1 to 8 satisfied Formula (2) above, whereas the etching rate V of the copper oxide layers 20 in each of the acidic solutions used in Comparative Examples 1 to 4 failed to satisfy Formula (2).

[Airtightness Test]
(Conditions in Common)

The lead frame 3 was prepared and the surface was washed, and the method (b) noted above was used to form, on the lead frame 3, copper oxide layers 20 with a density ρ (=6.26 mg/mm$^3$) and a thickness A (=1.5 μm) under the conditions exemplified above. The resin package main unit 11 was then formed under the conditions given in the resin adhesion step for described above, and a resin package 1a was produced using liquid crystalline polymer. The copper oxide layers were then removed (stripped) under the following conditions (Examples 9 to 16 and Comparative Examples 5 to 6). The temperature $T_1$ of the molds 30A and 30B during the injection of the resin material was 300° C. in all of Examples 9 to 16 and Comparative Examples 5 and 6.

Test Conditions in Examples 9 to 16

In Examples 9 to 16 (see FIG. 7), the copper oxide layers were removed (stripped) using sulfuric acid ($H_2SO_4$), nitric acid ($HNO_3$), and hydrochloric acid (HCl) with a predetermined concentration as the acidic solution (stripper) in the step for removing the copper oxide layers.

Test Conditions in Comparative Examples 5 to 6

In Comparative Examples 5 to 6 (see FIG. 7), the copper oxide layers were removed (stripped) using hydrochloric acid (HCl) with a predetermined concentration as the acidic solution (stripper).

To further clarify the relationship of the copper oxide layer etching rate V in the acidic solution (stripper) and the type of acidic solution (stripper) to the airtightness of the resin package 1a, no metallic layer was formed after the removal of the copper oxide layers in all of Examples 9 to 16 and Comparative Examples 5 and 6.

The time for which the layers were etched using the various acidic solutions (stripper) was also selected so as to fall within any of the ranges for the etching time T satisfying the requirements of Formula (1). Specifically, the etching time T was 300 sec (Example 9), 60 sec (Example 10), 60 sec (Example 11), 40 sec (Example 12), 270 sec (Example 13), 150 sec (Example 14), 40 sec (Example 15), 60 sec (Example 16), 35 sec (Comparative Example 5), and 60 sec (Comparative Example 6).

Examples 17 and 18

Test Conditions for Example 17

The copper oxide layers were removed (stripped) in the same manner as in Example 9 except that the temperature $T_1$ of the molds 30A and 30B during the injection of the resin material was changed to 281° C.

Test Conditions for Example 18

The copper oxide layers were removed (stripped) in the same manner as in Example 9 except that the temperature $T_1$ of the molds 30A and 30B during the injection of the resin material was changed to 269° C.

(Airtightness Test)

An airtightness test was conducted using the resin packages 1a of Examples 9 to 18 and Comparative Examples 5 and 6.

Figure 6:
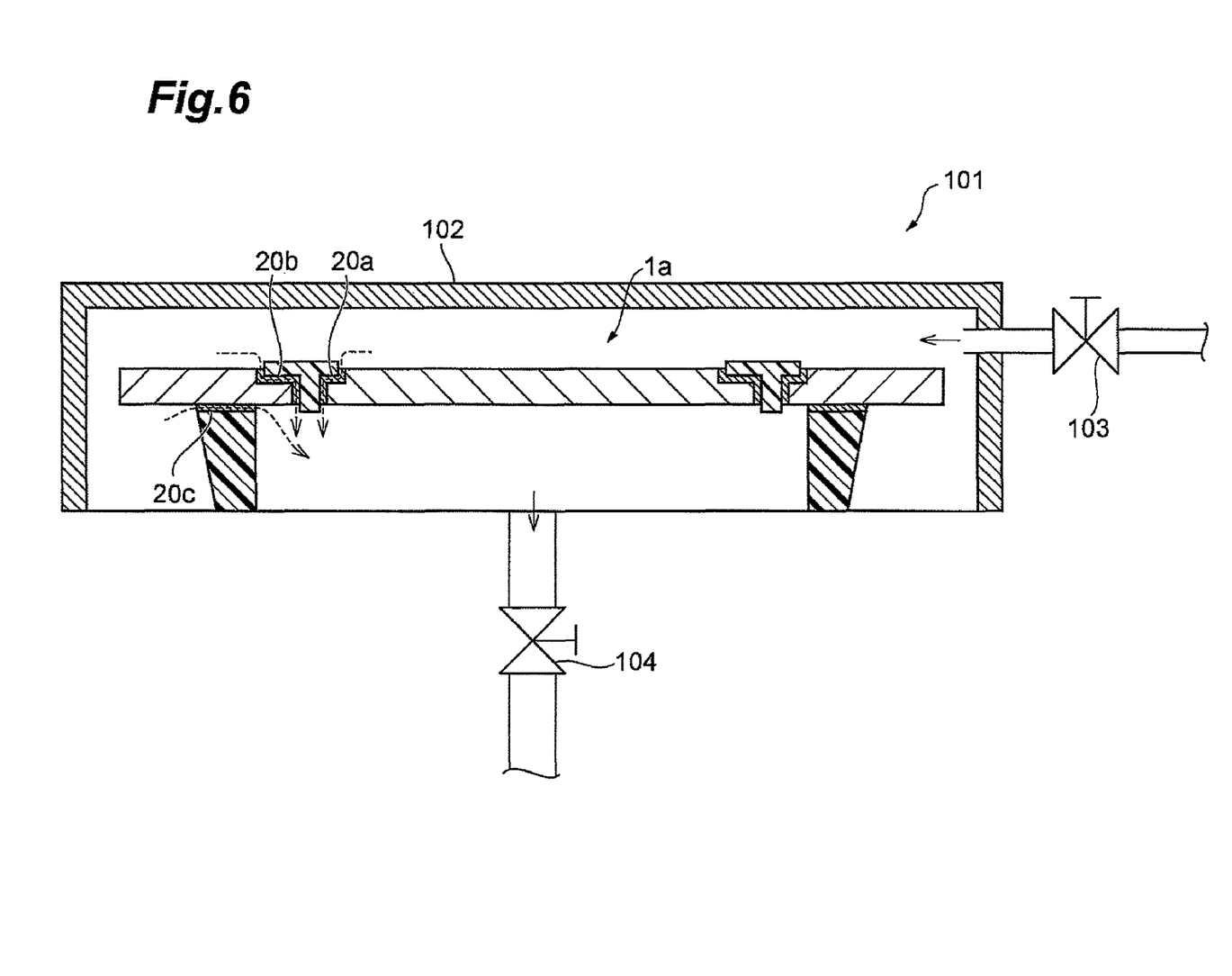
FIG. 6 is a schematic of an airtightness testing device 101.

FIG. 6 is a schematic of an airtightness testing device 101 used in the airtightness test. As shown in FIG. 6, the airtightness testing device 101 was equipped with a chamber 102, a gas feeder 103 for feeding inert He gas into the chamber 102, and a gas exhauster 104 for exhausting the air in the chamber 102 from the bottom of the chamber 102.

First, the above resin package 1a was inverted, and the resin package 1a was placed on the bottom of the chamber 102 in such a way that the side wall 13 of the resin package 1a surrounded the gas exhaust 104 in the bottom of the chamber 102. The air in the space S formed by the chamber 102 and the side wall 13 of the resin package 1a was evacuated by the gas exhauster 104, securing the resin package 1a to the bottom of the chamber 102. He gas was fed through the gas feeder 103 into the chamber 102, and the He gas was sensed in the gas exhauster 104 to check the airtightness of the main unit of the resin package 1a.

(Evaluation and Results)

Figure 7:
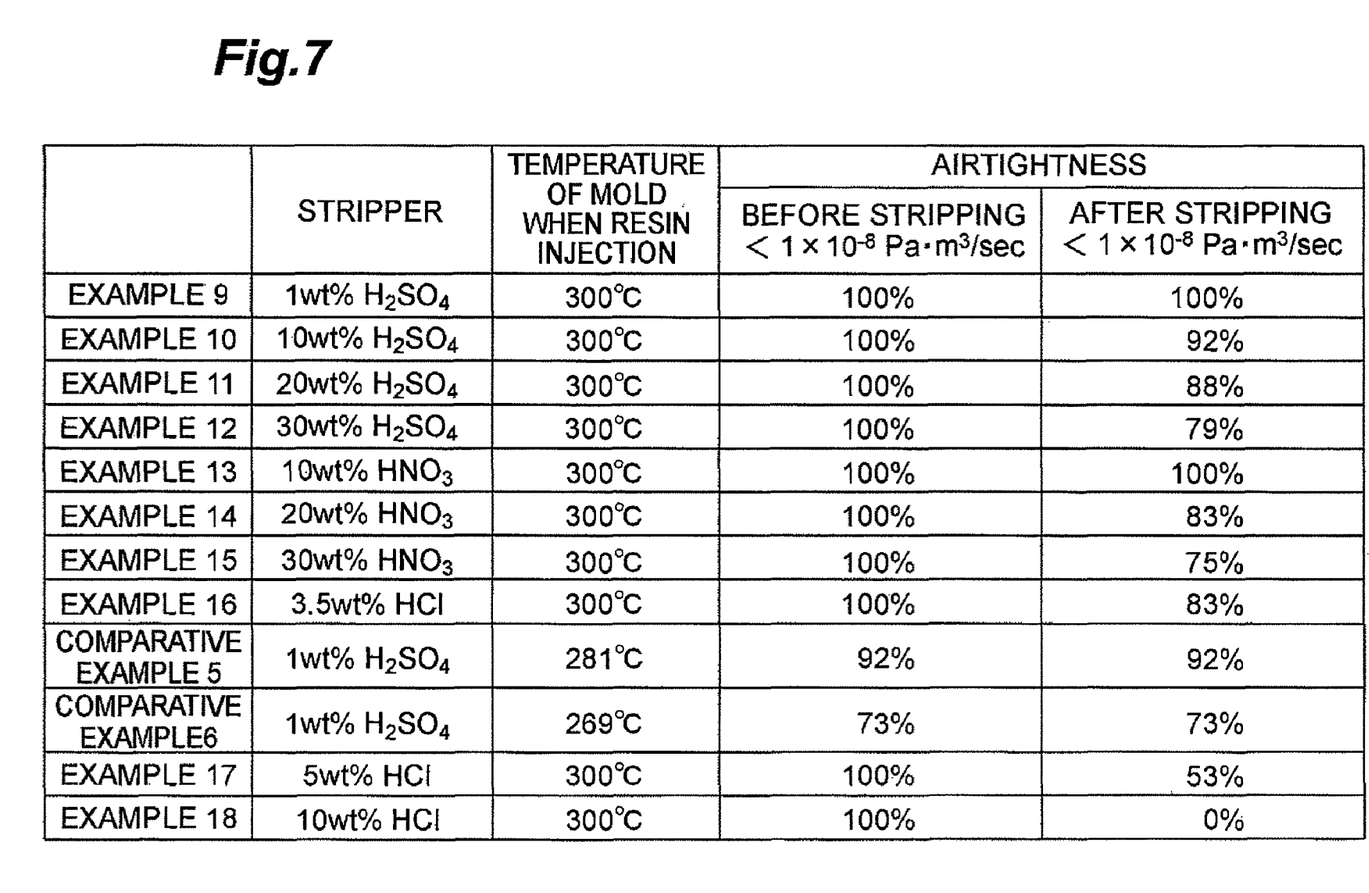
FIG. 7 is a table showing the relationship between the airtightness of the resin package 1a and the type and concentration of acidic solution.

The results of the test are shown in FIG. 7. FIG. 7 summarizes the results of the above airtightness test before and after the copper oxide layers were removed (stripped) in the resin packages 1a of Examples 9 to 18 and Comparative Examples 5 to 6. In FIG. 7, the airtightness is given as α/α$_0$×100%, where α$_0$ is the number of resin packages prepared, and α is the number of resin packages showing a He leak level of less than 1×10$^{-8}$ Pa·m$^3$/sec in the above airtightness test. The higher the airtightness level, the better the airtightness. Better airtightness means, specifically, that no He gas leaks (arrow in FIG. 6) through the copper oxide layers 20a, 20b, and 20c into the space S.

Because the copper oxide layers 20a, 20b, and 20c were not etched with an acidic solution (stripper) in the resin packages 1a before the copper oxide layers were removed (stripped) without the step for removing the copper oxide layers 20, the He leak level was less than $1 \times 10^{-8}$ Pa·m$^3$/sec in virtually all cases even when the air in the space S had been evacuated by the gas exhauster 104. Specifically, the airtightness was 100% in all the resin packages 1a produced in Examples 9 to 16 and Comparative Examples 5 and 6, wherein the temperature $T_1$ of the molds 30A and 30B was 300° C. when the resin material was injected. The airtightness was also 92% and 73% in the resin packages 1a produced in Examples 17 and 18, respectively, wherein the temperature $T_1$ of the molds 30A and 30B were 281° C. and 269° C., respectively, when the resin material was injected.

In contrast, when the airtightness was analyzed in the resin packages 1a after the copper oxide layers were removed (stripped), the airtightness in all the resin packages 1a produced in Examples 9 to 18 was 70% better compared to the resin package 1a of Comparative Examples 5 and 6, indicating better airtightness. This embodiment confirmed that sulfuric acid, nitric acid, and hydrochloric acid were preferred as the acidic solution (stripper) to remove (strip) the copper oxide layers 20 in order to ensure better airtightness by preventing the formation of through holes as a result of etching in the copper oxide layers between the lead frame 3 and resin package main unit 11 even as the copper oxide layers 20 on the die pad 5 are removed (stripped) by etching.

Example 9, Example 17, and Example 18 showed that the airtightness tended to be lower, before and after the copper oxide layers are removed (stripped), when the temperature $T_1$ of the molds 30A and 30B during the injection of the resin material was lower.

Formula (1) above includes theoretically derived conditions for improving airtightness. The airtightness test in the examples confirmed that it is difficult to ensure better airtightness when the conditions of Formula (2) are not satisfied based on the etching rate V in predetermined acidic solutions (strippers) obtained in the etching rate confirmation test, even when the etching rate V (mg/min·mm$^2$) of all the Examples (9 to 18) and the Comparative Examples (5 and 6) satisfies the conditions of Formula (1), which are conditions involving theoretical values. That is, both Formula (1), which involves theoretical conditions, and Formula (2), which involves experimental conditions, are preferably combined in order to improve airtightness through the airtightness test in this example.

What is claimed is:

1. A method for producing a resin package, comprising the steps of:
   (A) forming a copper oxide layer by oxidizing a surface of a lead frame in which at least the surface is made of copper,
   (B) forming a resin package main unit by allowing a resin to adhere to the copper oxide layer on the lead frame by resin molding for package, and then removing a predetermined area of the copper oxide layer with an acidic solution, and
   (C) forming a metallic layer in the predetermined area from which the copper oxide layer has been removed after step (B).

2. The method for producing a resin package according to claim 1, wherein
   the lead frame comprises
      a die pad on which an electronic element is to be arranged, and a lead area composed of a plurality of lead terminals,
   the resin package main unit comprises
      a bottom portion disposed between the copper oxide layer on a side of the die pad and the copper oxide layer on a side of the lead area, and
      a side wall that is provided upright on the copper oxide layer on the lead area while surrounding the die pad, and
   the predetermined area is an area surrounded by the side wall in the lead area.

3. The method for producing a resin package according to claim 2, wherein in step (C),
   a copper oxide layer thickness A (μm),
   a lowest value d (μm) among $t_1$, $t_2$, and $t_3$,
   a copper oxide layer density ρ (mg/mm$^3$), and
   an etching rate V (mg/min·mm$^2$) and etching time T (min) of the copper oxide layer in the etching solution satisfy a following relational expressions:

$$d > (V/\rho) \times 1000 \times T > A,$$

and $$2.0 \times 10^{-3} \leq V \leq 2.6 \times 10^{-2},$$

where the $t_1$ is a thickness of the side wall in a direction perpendicular to a thickness direction of the copper oxide layer at an interface between the copper oxide layer and the side wall,
   the $t_2$ is a minimum total length from an inside surface of the bottom portion to an outside surface thereof, of the copper oxide layer formed along an interface between the bottom portion and the die pad, and
   the $t_3$ is a minimum total length from the inside surface of the bottom portion to the outside surface thereof, of the copper oxide layer formed along an interface between the bottom portion and the lead area.

4. The method for producing a resin package according to claim 1, wherein in step (A),
   the oxidizing method is a method selected from the group consisting of
   (a) a method for heating the lead frame in an oxygen atmosphere,
   (b) a method for immersing the lead frame in an alkali aqueous solution,
   (c) a method for immersing the lead frame in an alkali aqueous solution and anodizing the lead frame, and
   (d) a method for immersing the lead frame in an electrodeposition solution containing cupric ions, and providing current to the lead frame.

5. The method for producing a resin package according to claim 1, wherein the acidic solution includes at least one acid selected from the group consisting of sulfuric acid, nitric acid, and hydrochloric acid.

6. The method for producing a resin package according to claim 1, wherein in step (B), a resin is injected into a mold to perform molding, the resin being a thermoplastic resin, and a temperature $T_1$ (° C.) of the mold when the resin is injected therein and a flow-starting temperature $T_2$ (° C.) of the resin satisfy a following relational expression:

$$T_1(° C.) \geq T_2(° C.) - 70(° C.).$$

7. The method for producing a resin package according to claim 6, wherein the thermoplastic resin is a liquid crystalline polymer.

* * * * *